United States Patent [19]

Furuya et al.

[11] Patent Number: 4,985,898

[45] Date of Patent: Jan. 15, 1991

[54] NARROW-BAND LASER APPARATUS

[75] Inventors: Nobuaki Furuya, Kawasaki; Takuhiro Ono, Zama; Naoya Horiuchi; Keiichro Yamanaka, both of Kawasaki; Takeo Miyata, Zama, all of Japan

[73] Assignee: Matsushita Electric Industrial Co., Ltd., Japan

[21] Appl. No.: 487,080

[22] Filed: Mar. 1, 1990

[30] Foreign Application Priority Data

| Jun. 14, 1989 | [JP] | Japan | 1-151789 |
| Nov. 1, 1989 | [JP] | Japan | 1-286840 |
| Jan. 12, 1990 | [JP] | Japan | 2-4984 |
| Jan. 12, 1990 | [JP] | Japan | 2-4985 |
| Jan. 12, 1990 | [JP] | Japan | 2-4986 |

[51] Int. Cl.$^5$ .............................................. H01S 3/08
[52] U.S. Cl. ...................... 372/106; 372/102; 372/57; 372/100
[58] Field of Search ............... 372/57, 106, 102, 99, 372/100

[56] References Cited

U.S. PATENT DOCUMENTS

| 4,829,536 | 5/1989 | Kajiyama et al. | 372/57 |
| 4,905,243 | 2/1990 | Lokai | 372/32 |
| 4,914,662 | 4/1980 | Lokai | 372/32 |

FOREIGN PATENT DOCUMENTS 63-160287 7/1988 Japan .

Primary Examiner—Léon Scott, Jr.
Attorney, Agent, or Firm—Lowe, Price, LeBlanc, Becker & Shur

[57] ABSTRACT

A laser apparatus comprises an optical resonator including first and second mirrors, and lasing medium. An wavelength selection element is provided in the resonator for narrowing band-width. A polarizing conversion element for changing ratio of S to P components and polarizing beam splitter are provided for amplifying laser beam to output after wavelength selection and for reducing light load of the wavelength selection element. The polarizing conversion element is provided in the resonator light path. In another embodiment, the polarizing conversion element is provided in a branch light path formed by a second polarizing conversion element and a third mirror, where the second polarizing conversion element reflects and transmits P component at a given ratio and reflects S component. The wavelength selection element comprises a Fabry-Perot etalon, grating, or prism. The polarizing conversion element comprises a quarter-wave plate or a phase retarder mirror. The polarizing beam splitting element comprises a polarizing beam splitter or polarizing beam splitting prism. The polarizing beam splitter and phase retarder prism may have a fine adjusting mechanism to adjust its optical axis to obtain desired characteristic. Such laser apparatus is suited for an exposure light source for photolithography.

22 Claims, 17 Drawing Sheets

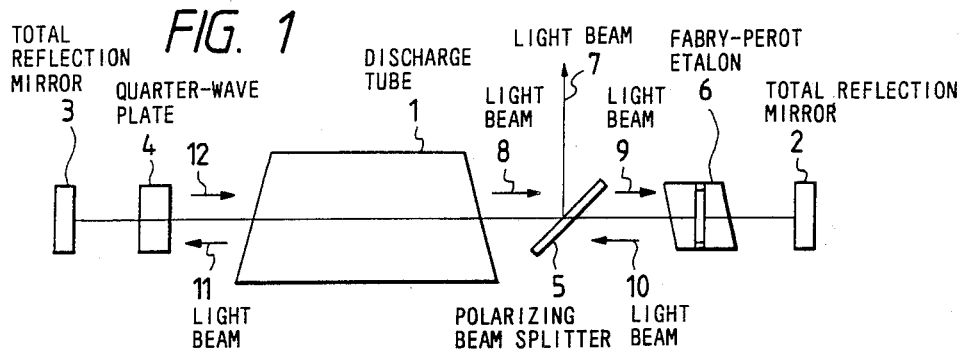
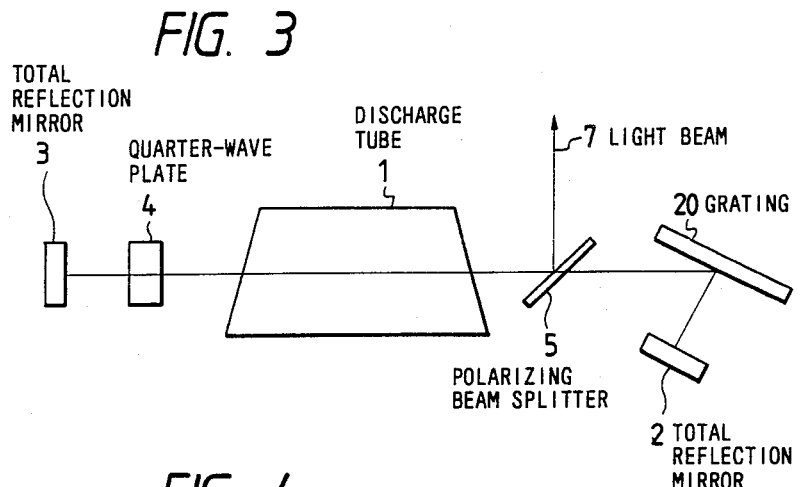
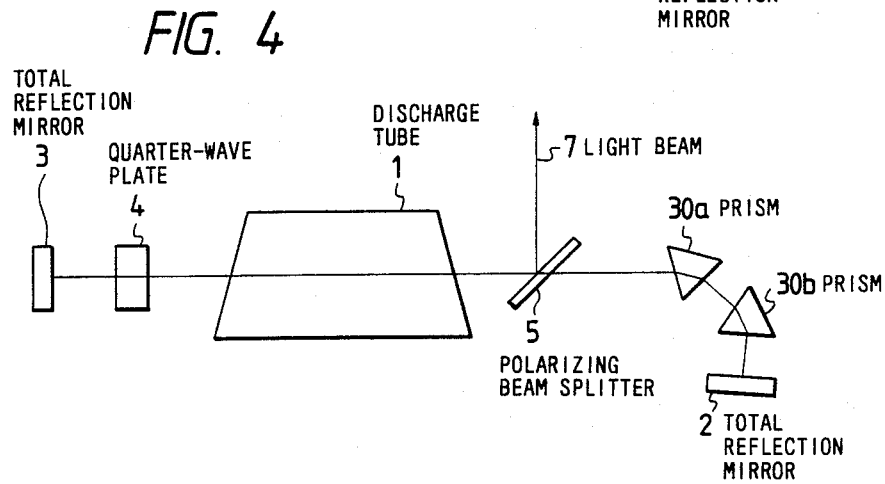

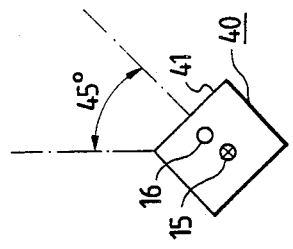
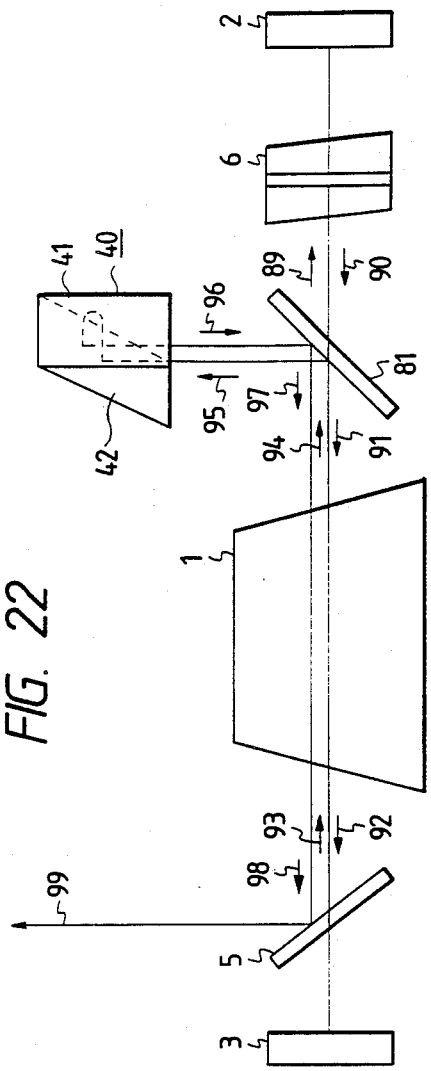

NARROW-BAND LASER APPARATUS

BACKGROUND OF THE INVENTION

1. Field of the Invention

This invention relates to a narrow-band laser apparatus.

2. Description of the Prior Art

The excimer laser has attracted attention as a light source for photolithography. The excimer laser can output a laser light beam having efficient power for exposing a photoresist film on a semiconductor wafer at several wavelengths between 353 nm to 193 nm through a laser medium comprising a noble gas, such as krypton and xenon gases, and halogen gas, such as fluorine and chlorine gases. Gain-band width of the excimer laser is approximately one nm which is too large for the exposure light source for photolithography. Band width output laser light of the excimer laser is about 0.5 nm (full width at half maximum). If such relatively broad band laser light is used as an exposing, an achromatic exposing optical system is necessary in exposing apparatus for photolithography. However, in ultraviolet region, less than 350 nm, achromatization is difficult because there are few types of optical materials which can be used for a focusing lens system. It is desired to narrow band width of the excimer laser used for the exposure light source whose band-width is around 0.005 nm. Such exposure light source enables a focusing lens system without achromatization to be used, so that simplification of the optical system of the exposing apparatus for photolithography and miniaturization and lowering cost of the exposing apparatus can be realized.

A laser apparatus for exposure which comprises an wavelength selection element provided in its optical resonator for narrowing bandwidth of laser light without attenuation of output power is described in Japanese patent application provisional publication No. 63-160287 which is described below.

FIG. 7 is a front view of the narrow-band excimer laser of the above-mentioned prior art. In FIG. 7, this prior art laser apparatus comprises an optical resonator including a total reflection mirror 102, a half mirror 103 and a discharge tube 101 provided in a light path of the optical resonator, and a Fabry-Perot etalon 104 as an wavelength selection element. In this laser apparatus, only light whose wavelength is selected by Fabry-Perot etalon 104 is amplified and oscillates, so that an extremely narrow-band laser light beam is obtained.

However in such excimer laser apparatus, there is a drawbacks that because there is high energy light continuously exists in the optical resonator, the wavelength selection element is deteriorate or deformed, so that the selection wavelength will change or output power will decrease. If such excimer laser apparatus is used as a light source for exposure, defected products of integration circuits are manufactured. In other words, maximum power of the excimer laser is limited by high-energy-light resistivity of the selection element.

SUMMARY OF THE INVENTION

The present invention has been developed in order to remove the above-described drawbacks inherent to the conventional excimer laser apparatus.

According to the present invention there is provided a laser apparatus comprising: an optical resonator including first and second mirrors, laser medium provided in a light path of the resonator for emitting light, th laser medium including an exciting electrodes; a polarizing beam splitting element provided between the first mirror and the laser medium in the light path of the optical resonator for transmitting a first polarizing component therethrough and reflecting a second polarized component of the light; a selection element provided between the first mirror and the polarized beam splitting element in the light path for selecting a given wavelength component from the second polarizing component of the light; and polarizing conversion element provided between the polarizing beam splitting element and the second mirror in the light path for producing the first and second polarizing components in response to the light.

According to the present invention there is also provided a laser apparatus comprising: an optical resonator including first and second mirrors, laser medium provided in a light path of the optical resonator for emitting light, the laser medium including an exciting electrodes; a first polarizing beam splitting element for transmitting a first polarizing component partially and reflecting a second polarizing component of the light; a selecting element provided between the first mirror and the first polarizing beam splitting means for selecting a given wavelength component from the second polarizing component of the light; a third mirror for reflecting back a light ray from the polarizing beam splitting element, the polarizing conversion element provided between the first polarizing beam splitting element and the third mirror for converting the first polarizing component into second polarizing component in response to the light ray; and second polarizing beam splitting element for transmitting the first polarizing component and reflecting the second polarizing component of the light provided between the laser medium and the second mirror.

The wavelength selection element comprises one or more Fabry-Perot etalons, gratings, or prisms. The beam polarizing conversion element comprises a quarter-wave plate, a phase retarder prism or a phase retarder mirror. The polarizing beam splitting element comprises a polarizing beam splitter or polarizing beam splitting prism. The polarizing beam splitter or phase retarder prism may have a fine adjusting mechanism to adjust its optical axis to obtain desired characteristic. An echlle grating or echelon grating may be used in replace with the first reflection mirror and the Fabry-Perot etalon. A phase retarder mirror may be used in replace with the second mirror and the wavelength phase plate. A polarizing beam splitting prism may be used as a polarizing beam splitting element and wavelength selection element in combination with a Fabry-Perot etalon.

BRIEF DESCRIPTION OF THE DRAWINGS

The object and features of the present invention will become more readily apparent from the following detailed description taken in conjunction with the accompanying drawings in which:

FIG. 1 is a front view of a first embodiment of a laser apparatus of the invention;

FIG. 3 is a front view of a second embodiment;

FIG. 4 is a front view of a third embodiment;

FIG. 22 is a front view of an twelfth embodiment;

FIG. 23 is a bottom view of a portion of FIG. 22;

The same or corresponding elements or parts are designated at like references throughout the drawings.

DETAILED DESCRIPTION OF THE INVENTION

Figure 2:
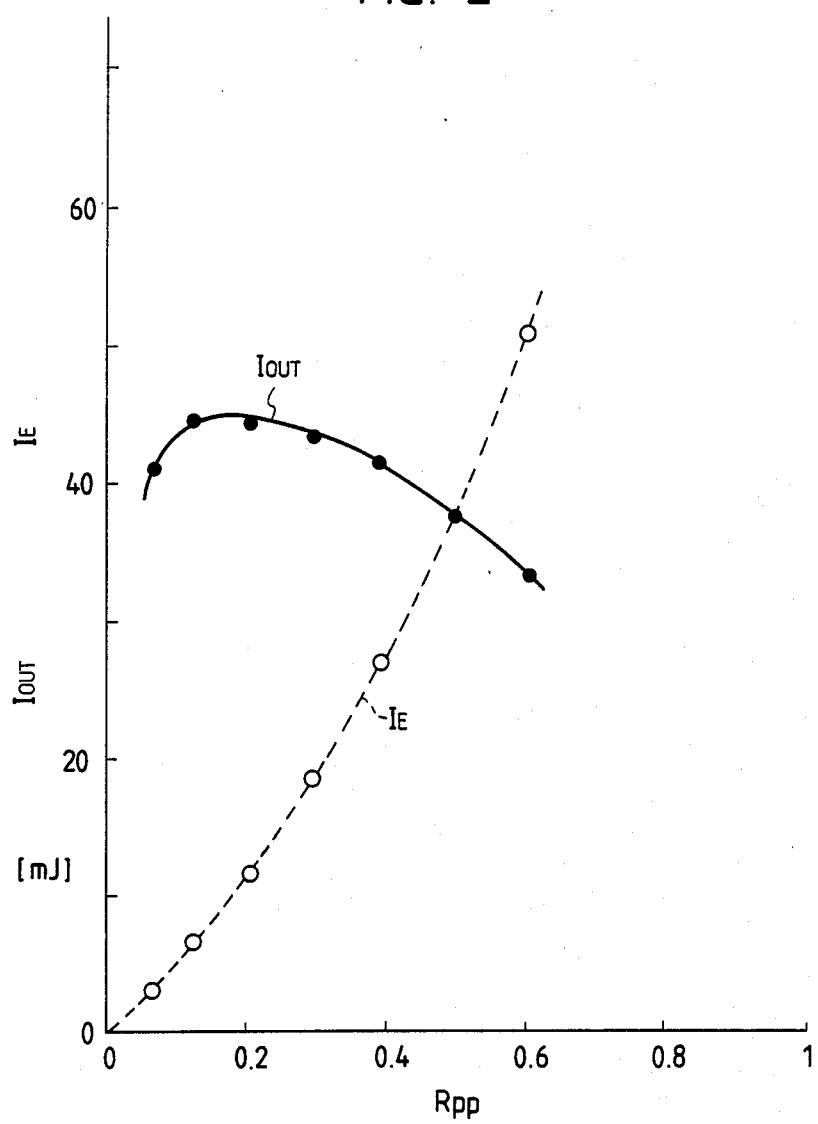
FIG. 2 is an explanatory chart of the first embodiment.

Referring now to the drawings, FIG. 1 is a front view of a first embodiment of a narrow-band excimer laser apparatus of the invention.

In FIG. 1, a discharge tube 1 comprises a mixed gas of noble and halogen gases as a laser medium. An optical resonator comprises total reflection mirrors 2 and 3 and the discharge tube 1 is provided in the light path of the optical resonator between the total reflection mirror 2 and 3. When the discharge tube 1 is excited a laser beam of ultraviolet is generated there. A quarter-wave plate 4 as a polarizing conversion element for changing ratio of P to S polarizing components and a polarizing beam splitter 5 as a polarizing beam splitting element are provided in the light path of the optical resonator, as shown. An output light beam 8 amplified by the laser medium of the discharge tube 1 is separated into one polarized light beam 7 outputted externally and another polarized light beam 9 by the polarizing beam splitter 5.

A Fabry-Perot etalon 6 as an wavelength selection element is provided between the polarizing beam splitter and the total reflection mirror 2, so that only specified narrow-band light beam is oscillated in the optical resonator.

Hereinbelow will be described operation of the laser apparatus of the first embodiment.

The light beam 8 amplified by the laser medium of the discharge tube 1 is splitted in accordance with polarized components. One polarized component is outputted as the output light beam 7. Another component light beam, i.e., a light beam 9, is transmitted through the polarizing beam splitter 5. The light beam 9 is subjected to wavelength selection by Fabry-Perot etalon 6, and then it is reflected at the total reflection mirror 2. The reflected light beam 10 is transmitted through the Fabry-Perot etalon 6 and the polarizing beam splitter 5 again and is amplified by the laser medium. The amplified light beam 11 enters the quarter-wave plate 4. The light beam 11 is transmitted through the quarter-wave plate 4 twice via the total reflection mirror 3 to produce a reflection light beam 12. This twice transmission through the quarter-wave plate 4 is equivalent to one transmission through a half wavelength plate. Thus, the light beam 11 polarized in one direction is converted into the reflection light beam 12 having both polarization components. Generally, it is possible to set a ratio between both polarization components of the reflected light beam 12 by changing rotational position of the quarter-wave plate 4 around the center of the axis of the light path. The reflected light 12 is amplified by the laser medium of the discharge tube 1 to produce the light beam 8. One polarization component of the light beam 8 is reflected at the polarizing beam splitter 5 as the output light beam 7. Another component is transmitted through the polarizing beam splitter 5 as the light beam 9 which maintains oscillation. Here, lasing coupling ratio of the output light beam 8 can be changed by varying ratio between intensities of the output light beam 7 and transmitted light beam 9 by rotation of the quarter-wave plate 4. As mentioned above, an intensity of the output light beam 7 is larger than that of the light beam 9 to the extent of a gain of the laser medium so that deformation and deterioration of the Fabry-Perot etalon 6 is considerably reduced.

FIG. 2 shows an experimental result showing a relationship between output laser light intensity Iout and light intensity $I_E$ at the Fabry-perot etalon 6 of the first embodiment with respect to reflectance of P component of the polarizing beam splitters, i.e., coupling ratio for laser oscillation. The result is obtained using KrF excimer laser of FIG. 1. The mixed gas of laser medium comprises 0.22% of $F_2$, 4.4% of Kr, and remains of He. Full pressure is 1800 mb. Laser oscillation is performed by application of a supply voltage of 28 KV to the discharge tube 1. The resultant shows Iout and Fabry-Perot etalon load $I_E$ per one pulse under this condition. FIG. 8 shows another experimental result under the same condition, which shows the same relation with respect to reflectance R of a half mirror 103 of the prior art of FIG. 7. In FIG. 2, the maximum output laser light intensity Iout is about 44 mJ and at the same time, Fabry-Perot etalon load $I_E$ is about 10 mJ. On the other hand, In FIG. 8 of prior art, the maximum output laser light intensity Iout is about 14 mJ and at the same time, etalon load $I_E$ is about 23 mJ. Therefore, output light intensity Iout of the first embodiment is about three times that of the prior art of FIG. 7, on the other hand, Fabry-Perot etalon load $I_E$ is about 58% of the prior art.

In the embodiment mentioned above, Fabry-Perot etalon 6 is used as an wavelength selection element. However, other wavelength selection elements can be used. Hereinbelow will be described such structure.

Referring to FIG. 3, a second embodiment of the invention is described. In FIG. 3 which is front view of the second embodiment, structure of this embodiment is the same as that of the first embodiment expect that a grating 20 is provided in replace with Fabry-Perot etalon 6. The grating 20 as an wavelength selection element provided between the polarizing beam splitter 5 selects a given wavelength by diffraction of light and diffracted light is reflected by the totol reflection mirror. Thus, the light resonating is formed by diffracted light by the grating 20. Functions of other portions are the same as the first embodiment. Thus, detailed description is omitted.

Referring to FIG. 4, a third embodiment of the invention will be described. In FIG. 4 which is a front view of the third embodiment, structure of this embodiment is the same as that of the first embodiment expect that prisms 30a and 30b are provided in replace with Fabry-Perot etalon 6. The prisms 30a and 30b provided between the polarizing beam splitter 5 and the total reflection mirror 2 select a specific wavelength by refraction of light is provided in the light path of the resonator. The resonator light path is formed total reflection mirrors 2 and 3 through the prisms 30a and 30b. Functions of other portions are the same as that of the first embodiment. Thus, detailed description is omitted.

As mentioned above, embodiments using a Fabry-Perot etalon, a grating 20, and prisms 30a and 30b as an wavelength selection element are described. When the Fabry-Perot etalon is used, it is considered that the reflection planes thereof where high energy is confined by multi-reflection between confronting reflection planes tends to be deteriorated. This is because this optical element selects wavelength by interference between the two reflection planes confronted. On the other hand, when the grating 20 or prisms 30a and 30b described in second and third embodiments is used deterioration is reduced because wavelength selection is performed by reflection or refraction, so that high-energy-light resistivity of these elements is several times as high as that of Fabry-Perot etalon. Therefore, output power of laser beam over 20 W can be obtained according to second or third embodiment.

Figure 5:
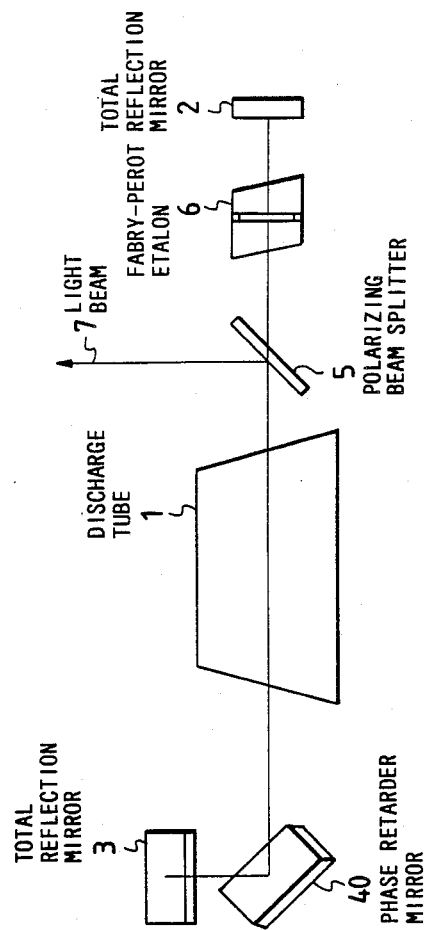
FIG. 5 is a front view of a fourth embodiment.

Referring to FIG. 5, a fourth embodiment of the invention will be described. FIG. 5 is a front view of fourth embodiment of a narrow-band laser apparatus. In FIG. 5, lasing is performed at ultraviolet region by an optical resonator comprising total reflection mirrors 2 and 3 and a discharge tube 1 including a mixed gas of noble and halogen gases as a laser medium provided between the total reflection mirrors 2 and 3. In a light path of the resonator, a phase retarder mirror 40 and polarizing beam splitter 5 are provided. The output light beam 7 amplified by the laser medium of the discharge tube 1 is outputted via the polarizing beam splitter 5. In the light path between polarizing beam splitter 5 and total reflection mirror 2, a Fabry-Perot etalon 6 as wavelength selection element is provided so that the optical resonator allows the specified narrow-band light to run therethrough to produce a narrow-band laser beam. In the fourth embodiment, the phase retarder mirror is used in replace with the quarter-wave plate 4 used in the first embodiment. Thus, this portion will be described in detail but other portions are omitted.

Figure 6:
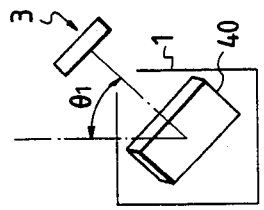
FIG. 6 is a side view of a fourth embodiment.

The phase retarder mirror 40 acts as a polarizing conversion element. The phase retarder mirror 40 comprises a dielectric thin film layer on the surface of a reflection mirror and generates S-polarized and P-polarized light having a phase difference of 90° components therebetween from obiquly incident light thereto. The phase retarder mirror 40 is provided in the light path of the optical resonator defined by the total mirrors 2 and 3 and changes directions of planes of polarization. The ratio $R_{pp}$ of P-polarization component of incident light to output P-polarization component varies with an angle $\theta_1$ (see FIG. 6 of side view) between the incident plane of the polarizing beam splitter 5 and the light path made by the phase retarder mirror 40 and the total reflection mirror 3. This ratio $R_{pp}$ changes coupling ratio for laser oscillation. The phase retarder mirror 40 with a large diameter can be made easily; resists high-power laser beam; and produces less multi-reflection light. Thus, it is suitable for a polarizing conversion element used in the narrow-band laser apparatus for anexposure light source. A grating 20 or prisms 30a and 30b described in the second and third embodiment can be used as an wavelength selection element in this embodiment.

As mentioned above, there various types of polarizing conversion elements for producing polarizing components, each component having polarizing plane different from each other, such as Fresnel rhomboid prism, thee-time total reflection ultra-achromatic quarter-wave plate, etc. In order to multiple-order quarter-wave exposure, as first-order or multiple-order quarter-wave plate using a crystal quartz plate is suitable. Moreover, it is necessary that quarter wave-plate is not accurate. In other words, a quarter-wave plate 4 capable of changing the ratio between polarized components S and P can be used.

Further, a multilayer cube polarizing element, a transparent plate of Brewster's angle, an Wollaston prism, etc., can be used as a polarizing beam splitting element mentioned above. In order to obtain large diameter beam for exposure, a polarization beam split mirror is excellent.

Moreover, in the above-mentioned embodiments, the wavelength selection element is provided between the polarization beam splitter 5 and the total mirror 2. However, the wavelength selection element can be provided to other position except the light path from the laser medium to the polarization beam splitter where the output laser beam is the most powerful light beam.

It is not necessary that the total reflection mirrors used in the above-mentioned embodiment have 100% reflectance but it may be a reflectance which maintains optical resonating.

Figure 9:
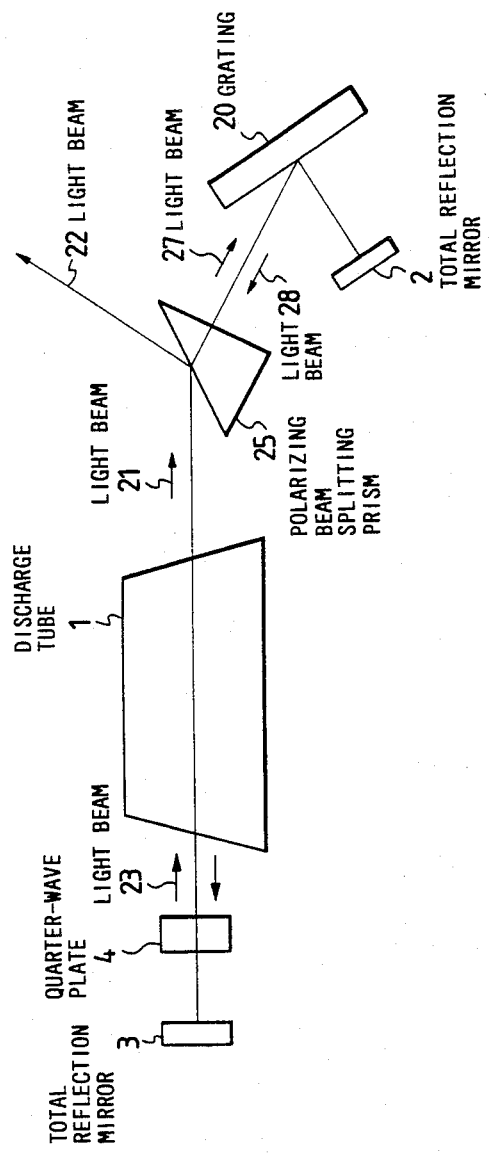
FIG. 9 is a front view of a fifth embodiment.

Hereinbelow will be described fifth embodiment. FIG. 9 is a front view of a fifth embodiment of the laser apparatus. In FIG. 9, the structure of this embodiment is the same as that of the second embodiment expect that a polarizing beam splitting prism 25 is provided in replace with the polarizing beam splitter 5. The polarizing beam spitting prism 25 separates the light beam 21 amplified by the discharge tube 1 into two beams in accordance with polarization components in the similar manner as described in the second embodiment. Functions of other portions are the same as the first embodiment. Thus, detailed description is omitted.

Light load in the grating 20 as an wavelength selection element can be reduced considerably because an intensity of the output light beam 22 is larger than that of the light beam 27 to the extent of a gain of the laser medium so that deformation and deterioration of the grating 20 is considerably reduced. More specifically, function of the polarizing beam splitting prism 25 will be described.

The polarizing beam splitting prism 25 has three combination functions. That is, the first function is separating propagation direction of a light beam in accordance with polarized component, the second function is selecting wavelength because it is a prism, and the third function is that it expands a light beam width (anamoriphic prism function). Generally, it is known that the larger the light beam 27 incident to the grating 20 is the higher wavelength selectivity the grating 20 shows because width of the light beam 27 incident to the grating 20 is expanded. As mentioned above, utilizing the polarizing prism 25 makes the above-mentioned three functions combined to simplify structure and adjusting optic axis of the apparatus, and reduces optical loss. This is because different discrete elements are not combined so that the number of optical surfaces is reduced. From the above-mentioned reasons, it is clear that there are more advantages in the case that the polarizing prism is used than in the case that a discrete polarizing separator and a conventional prism are used in combined state.

Figure 10:
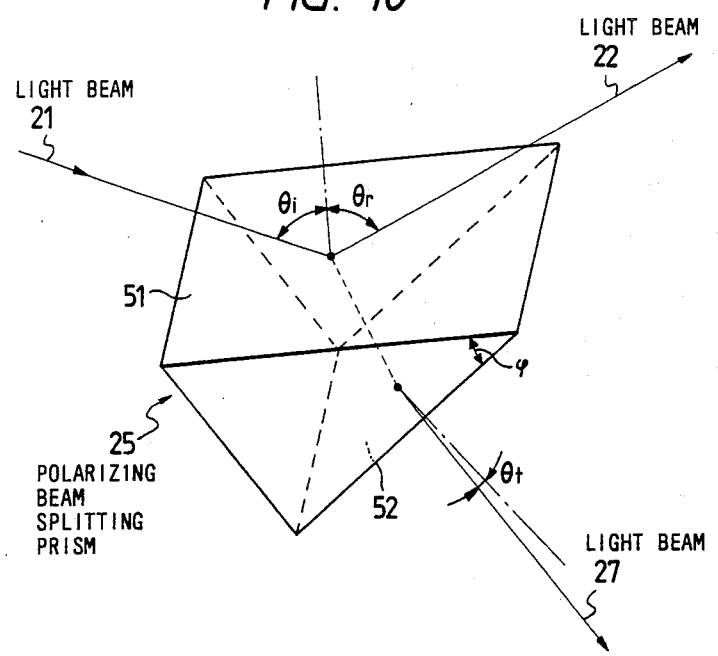
FIG. 10 is a perspective view of a portion of FIG. 9.

FIG. 10 is a perspective view of the above-mentioned polarizing beam splitting prism 25. Material of the prism 25 is transparent quartz or $CaF_2$ for excimer laser light and a polarizing beam splitting surface 51 is formed by dielectric multilayer on a surface 51 where the light beam 21 is incident. Generally, with selecting structure and thickness of dielectric layer, the multilayer can be formed to tranmit P polarizing component and reflects S polarizing component. Thus, the polarizing beam splitting prism 25 transmits only P polarizing component of the light beam 21 and reflects S polarizing component to output a light beam 22. Anti-reflection coat surface (AR coat surface) 52 is formed on an output surface of the light beam 22. The light beam 27 exits the surface 52 at angle $\theta t$. The angle $\theta t$ is selected such that it is small compared with the incident angle $\theta i$ by selecting an apex angle $\phi$ of the prism 52. For example, $\theta i$ is selected from 50° to 85° and $\theta t$ is, from 0° to 10° approximately. This causes width of the light beam 27 to be expanded compared with that of the incident light beam 21. The light beam 28 shown in FIG. 9 advances in the opposite direction to light beams 27 and 21 through the polarizing beam splitting prism 25.

Hereinbelow will be described a sixth embodiment of the invention.

Figures 11A, 11B:
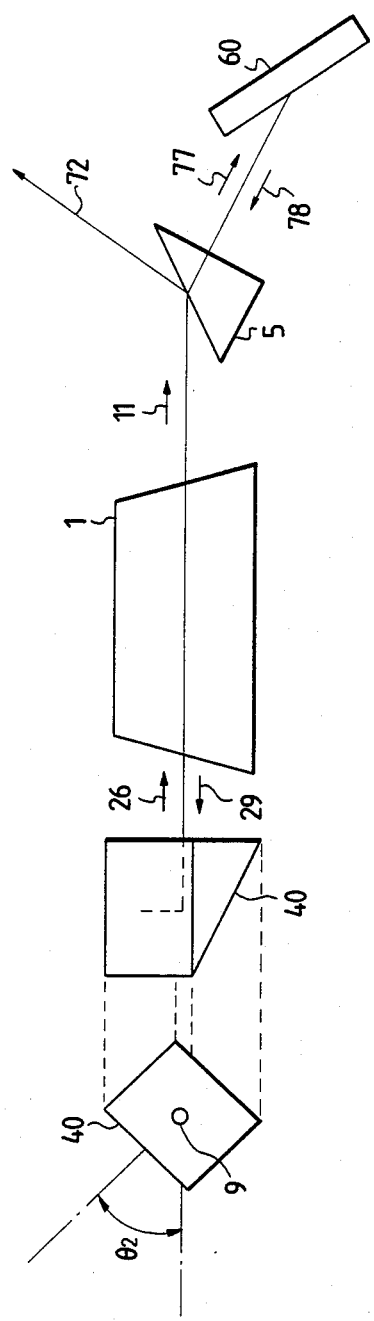
FIG. 11A is a front view of a sixth embodiment.
FIG. 11B is a side view of a portion of FIG. 11A.

FIGS. 11A and 11B show the sixth embodiment of the invention of a narrow-band laser apparatus. FIG. 11A is front view of the narrow-band laser apparatus and FIG. 11B is left side view of a phase retarder prism. In FIGS. 11A and 11B, the phase retarder prism 40 functions as the quarter-wave plate 4 and the second total mirror 3 described in the first embodiment. The grating 60 functions as the grating 6 and the total mirror 2 of the fifth embodiment. Structure of other portions are the same as that of the fifth embodiment.

Figure 12:
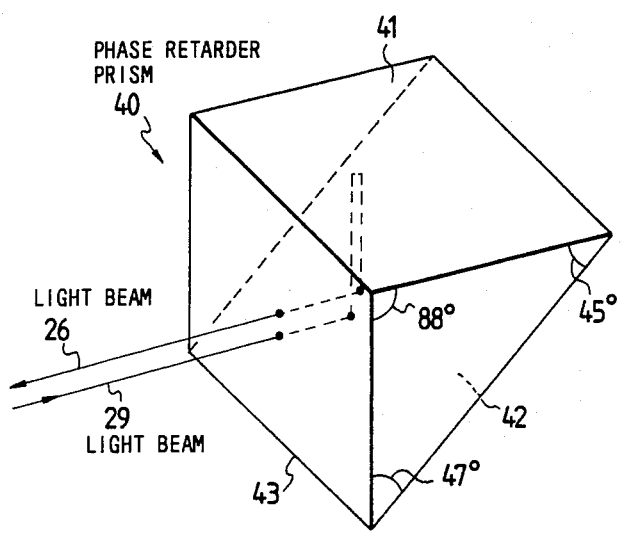
FIG. 12 is a perspective view of a portion of FIG. 11A.

FIG. 12 is a perspective view of the phase retarder prism 40. The phase retarder prism 40 is made of high-transmittance material, such as, synthesized quartz and $CaF_2$. Anti-reflection coat surface (AR coat surface) is formed on a surface 43 where a light beam 29 enters the phase retarder prism 40 and a light beam 26 exits. Further, this surface 43 is inclined by about 2° so that the incident light beam 29 directly reflected at this surface 43 is not mixed with the output light beam 26. Thus, this prism 40 has apex angles 45°, 47°, and 88° unlike the normal type 45° prism. A surface 42 reflects the light beam at a right angle. A dielectric multilayer is formed on the surface 42, which produces P and S polarizing components having 90° phase difference therebetween in accordance with structure and thickness of dielectric layers and is optically equivalent to the quarter-wave plate 4. The light beam reflected at the surface 42 is normally reflected at a total reflection surface 41 and outputted (light beam 26) in the opposite direction. The total reflection mirror surface 41 can be formed easily by a dielectric multilayer.

As mentioned above, according to this embodiment, the phase retarder prism 40 functions as the quarter-wave plate 4 and the second total reflection mirror 3 and thus, it makes the structure of the apparatus simple and adjustment easy.

Figure 13:
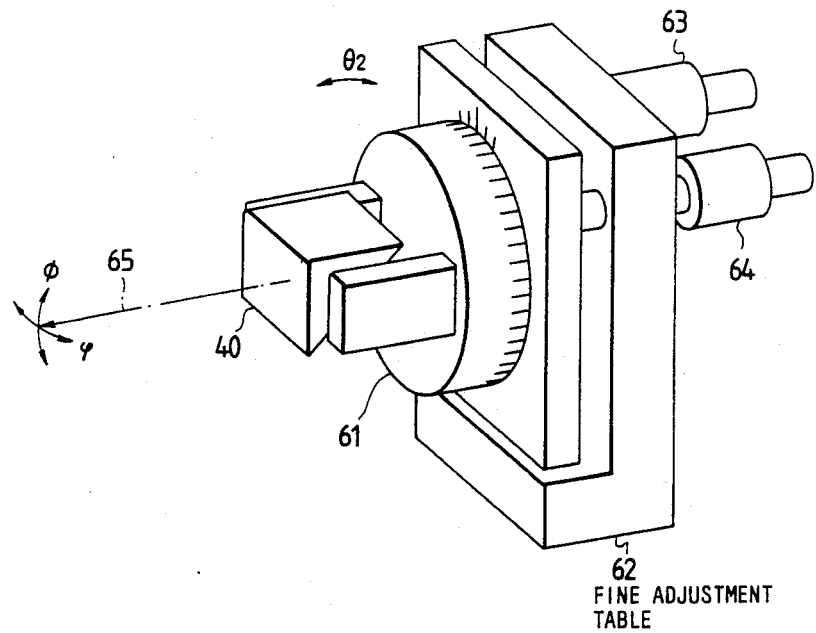
FIG. 13 is a perspective view of a mechanism of the sixth embodiment.

FIG. 13 is a perspective view of a mount for the above-mentioned phase retarder prism 40. As shown in FIG. 13, the phase retarder prism 40 is mounted on a turn table 61 which is supported by a fine adjustment table 62. Thus, the phase retarder prism 40 and the turn table can be turned with respect to a light path 65. Ratio of P to S polarizing components of the output light beam 26 of the phase retarder prism 40 can be changed by variation of the rotational angle $\theta_2$ which corresponds to $\theta_2$ shown in FIG. 11B. This adjustment is equivalent to that of variation in ratio of P to S polarizing components by the quarter-wave plate 4 of the above-mentioned first embodiment shown in FIG. 1. The fine adjustment table 62 and the phase retarder prism 40 are adjusted by fine micrometers 63 and 64 such that the optical axis of the apparatus is adjusted by fine adjustment of the angles $\theta$ and $\phi$ with respect to the light path 65.

Figure 15:
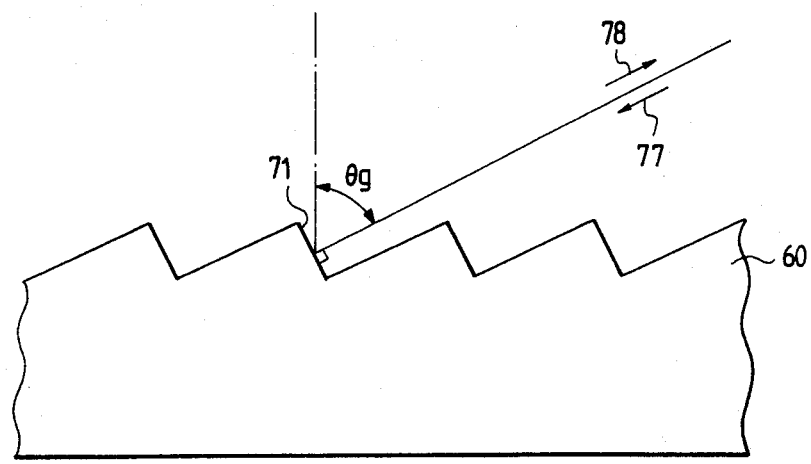
FIG. 15 is a partially enlarged front view of a grating of seventh embodiment.

The above-mentioned grating 60 shown in FIG. 11A outputs a light beam 78 such that the light path of the output light beam 78 is coincident with that of the incident light beam, such as echelle grating and echelon grating. For example, a reflection surface 61 reflects the incident light beam 77 at aright angle to output the light beam 78 as shown in FIG. 15. Such grating 60 functions as the grating 6 of the above-mentioned first embodiment shown in FIG. 1 and the first total reflection mirror 2. This structure achieves simplification in structure and provides easy adjustment.

Figure 14:
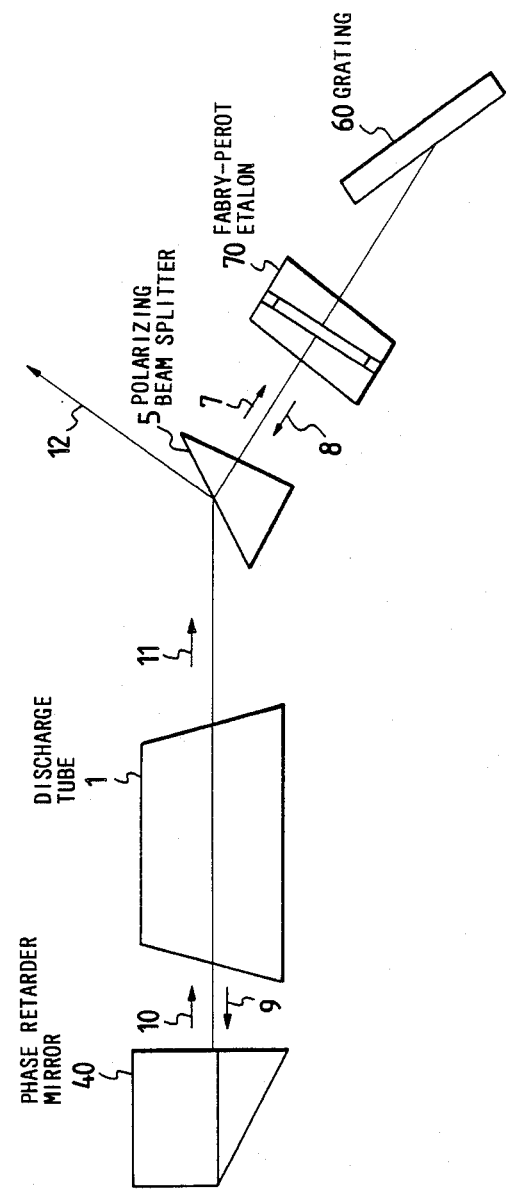
FIG. 14 is a front view of a seventh embodiment.

Hereinbelow will be described a seventh embodiment of the invention. FIG. 14 is a front view of a narrow-band laser apparatus of the seventh embodiment of the invention.

In this embodiment, a Fabry-Perot etalon 70 is used in addition to the grating 60 which functions as the grating 6 as an wavelength selection element and the first total reflection mirror 2 like the above-mentioned sixth embodiment shown in FIG. 11A. Structure of other portions are the same as that of the sixth embodiment shown in FIG. 11A. Generally, the Fabry-Perot etalon 70 has a good narrow-band selectivity compared with the grating 60. However, in the case of Fabry-Perot etalon used there is a tendency that spurious light generates because there are n−1$^{th}$ and n+1$^{th}$ oscillation around n$^{th}$ resonance oscillation. Therefore, in this embodiment, the grating 60 performs relatively coarse wavelength selection and the Fabry-Perot etalon 70, fine wavelength selection, so that it is possible to obtain laser light beam of narrow-band without spurious light. Thus, this embodiment can realize a laser apparatus which outputs a laser beam of narrow-band whose wavelength width is less than 2 pm by KrF excimer laser without decrease in output power. Moreover, it is possible to improve wavelength selectivity by using plural Fabry-Perot etalons 70.

Hereinbelow will be described an eighth embodiment of the invention.

Figure 16:
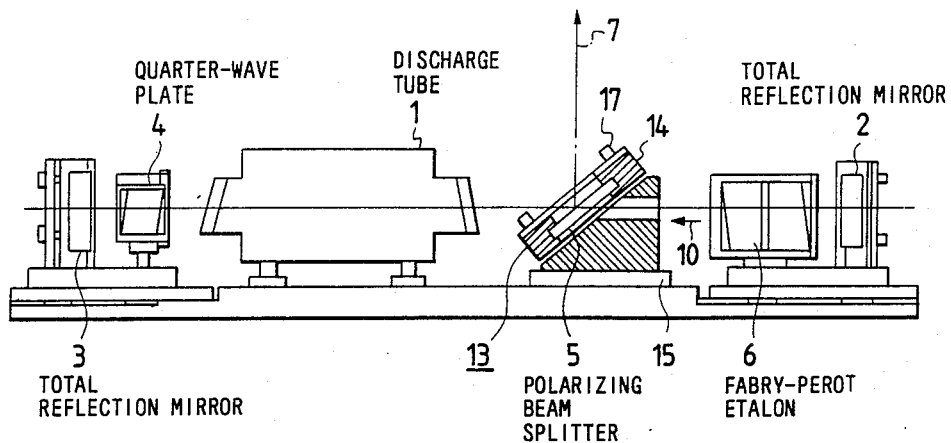
FIG. 16 is a front view of a eighth embodiment.

FIG. 16 is a front view of the eighth embodiment. The narrow-band laser apparatus of the eighth embodiment has the same structure as that of the first embodiment substantially. There is only difference in a fine adjustment mechanism of an incident angle of the polarizing beam splitter 5. This mechanism is provided for compensation of the polarizing beam splitting characteristic which varies with deviations in manufacturing the dielectric multilayer of the polarizing beam splitter 5.

It is desired that the dielectric multilayer is ideally formed. Actually, it is difficult to form dielectric multilayer film as designed. Thus, ratio of S to P polarizing components separated from the excimer laser light varies. As the result, intensity of the output light beam 7 reflected at polarizing beam splitter 5 decreases. On the other hand, loss in the light beam 10 oscillated after transmission through the polarizing beam splitter 5 and the Fabry Perot etalon 6 as an wavelength selection element becomes larger, and load of the Fabry-Perot etalon will change largely.

Figure 17:
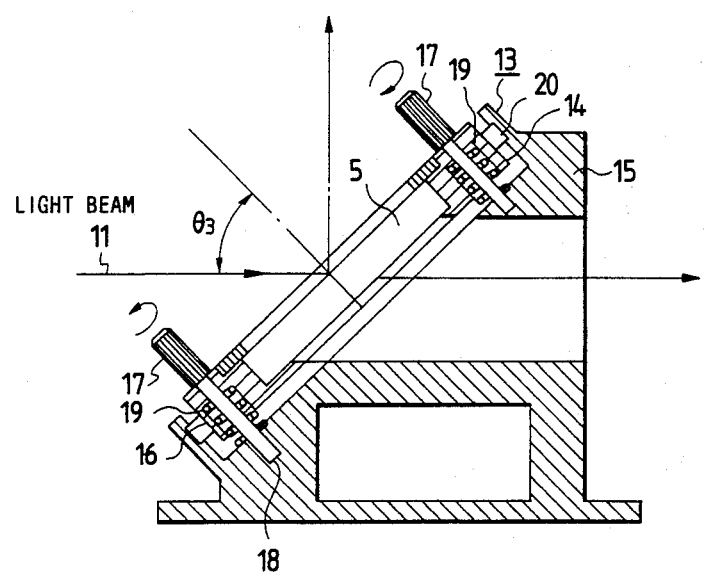
FIG. 17 is a cross-sectional view of a portion of FIG. 16.

In this embodiment, optimization of ratio between P and S polarizing components is performed such that inclination of the polarizing beam splitter 5 is changed by a fine adjustment mechanism 13 to change an incident angle of the polarizing beam splitter 5, as shown in FIGS. 16 and 17. In FIG. 16, the polarizing beam splitter 5 is fixed to a polarizing beam splitter holder 14. The polarizing beam splitter holder 14 is supported by a supporter 15 which enables angle adjustment of the polarizing beam splitter holder 14. The polarizing beam splitter holder 14 has a three adjusting screws 17 and coil springs 19 coaxially provided around the adjusting screws respectively as shown, each set of the adjusting screw 17 and coil spring 19 being provided for adjusting space between the holder 14 and the supporter 15 separately. Thus, the angle $\theta_3$ of the light beam 11 incident to the polarizing beam splitter 5 can be changed by separately turning of the adjusting screws. This causes variation of inclination angle of the polarizing beam splitter 5 and polarizing splitter holder 14 with respect to the supporter 15.

Figure 18:
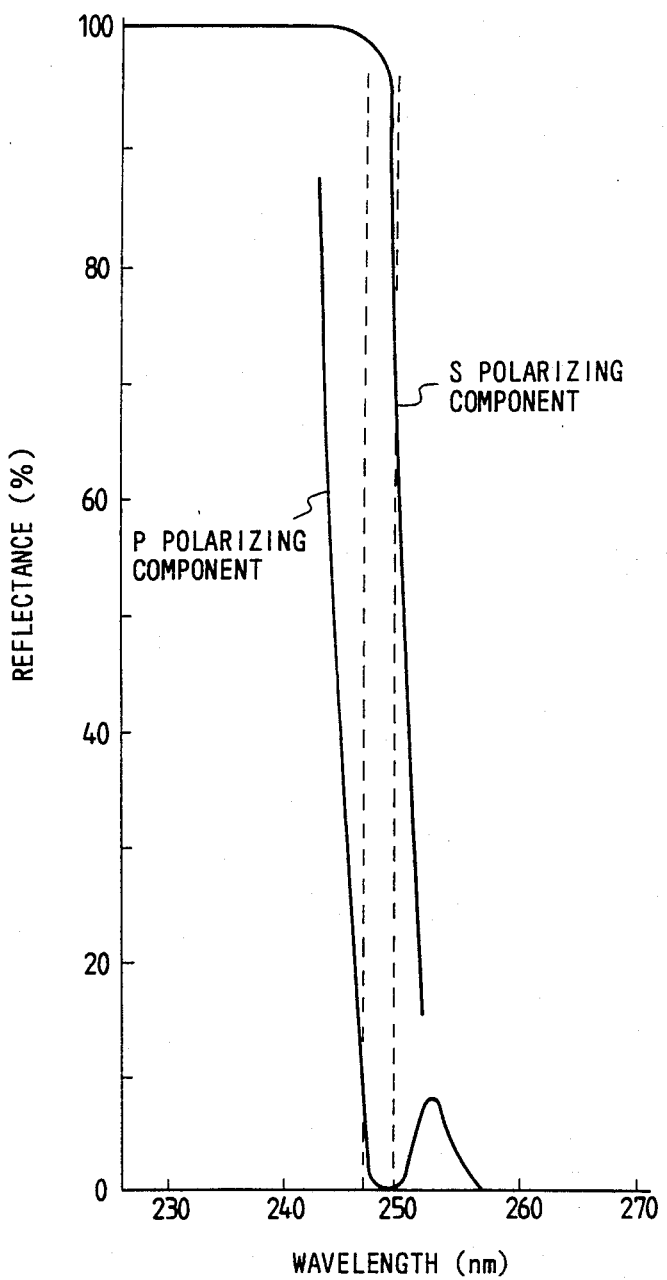
FIG. 18 is an explanatory chart of the eighth embodiment.

FIG. 18 shows a characteristic curve presenting reflectance of the polarizing beam splitter 5 on which a multilayer dielectric film is formed with respect to wavelength. Wavelength range where S polarizing component is sufficiently reflected and P polarizing component is sufficiently transmitted is narrow, as shown by dot lines in FIG. 18. In this example, this wavelength range is from 247 nm to 249.3 nm. The excimer laser apparatus of KrF oscillates at 248 nm. Thus, the above-mentioned polarizing beam splitter 5 can separate polarizing beam. However, as mentioned above, if polarizing beam splitters 5 are manufactured actually, deviations in thickness of the dielectric multilayer occur so that the wavelength range showing good beam splitting characteristic shown by the above mentioned dot lines varies to the extent of ± several nanometers. As the result, productivity of the polarizing beam splitter 5 decreases. However, fine adjustment of the incident angle (60° in this example) within ± several degrees changes the center of the wavelength range by ± over ten nm without characteristic shown in FIG. 18 largely changed. Thus, it is possible to match in wavelength characteristic of the polarizing beam splitter 5 to the laser light beam. Thus, productivity of the polarizing beam splitter 5 is improved and this fact is a large advantage effect in actual use.

As mentioned, according to the above-mentioned embodiment, even if deviations in forming dielectric multilayer of the polarizing beam splitter 5 occur, it is possible to optimize ratio between S and P polarizing components by adjusting the incident angle the polarizing beam splitter 5 with easy operation. Further, light load of the Fabry-Perot etalon 6 as an wavelength selection element is reduced and thus, an output power of the laser apparatus is stabilized.

Herein below will be described a ninth embodiment of the invention with referring to FIG. 19.

Figure 19:
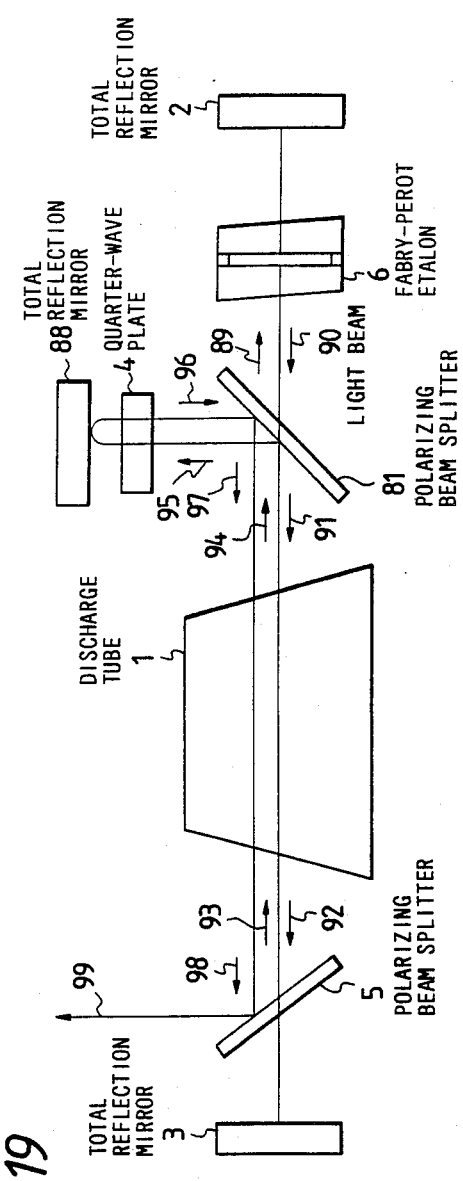
FIG. 19 is a front view of a ninth embodiment.

FIG. 19 is a front view of ninth embodiment of a narrow-band laser apparatus. In FIG. 19, an optical resonator comprises total reflection mirrors 2 and 3 and a discharge tube 1 is provided in the light path of the optical resonator between the total reflection mirrors 2 and 3 which includes a mixed gas of noble and halogen gases as a laser medium. When the discharge tube 1 is excited, a laser beam of ultraviolet is generated there. In a light path of the resonator a polarizing beam splitter 81 is provided between the discharge tube 1 and the first total reflection mirror 2. A polarizing beam splitter 5 is provided between the discharge tube 1 and the second total reflection mirror 3. The polarizing beam splitter 81 separates propagation directions of light beams having different polarizing components. However, a portion of one polarizing component is reflected at the polarizing beam splitter 81 and other portion is transmitted through the polarizing beam splitter. For example, the polarizing beam splitter 81 reflects 100% of S polarizing component but transmits a ratio T of S polarizing component and reflects a ratio (1-T) of S polarizing component. The ratio T ranges from 0.005 to 0.8 approximately. The polarizing beam splitter 5 separates propagation direction of light beams of different polarizing directions. For example, it transmits 100% of P polarizing light and reflects 100% of S polarizing light. A Fabry-Perot etalon 6 is provided between the polarizing beam splitter 81 and the first total reflection mirror 2 as an wavelength selection element. A quarter-wave plate 4 and a third total reflection mirror are provided in the light path separated at the polarizing beam splitter 81, i.e., the light path other than the light path of the resonator for maintaining oscillation.

Hereinbelow will be described operation of the above-mentioned embodiment.

The polarizing beam splitter 81 transmits amplified P polarizing beam 14 incident thereto partially. The transmitted P polarizing light beam 89 enters the Fabry-Perot etalon 6 as an wavelength selection element, which selects only a given wavelength component from the light beam 89. Then the light beam transmitted through the Fabry-Perot etalon 6 is reflected at the first total mirror 2. The polarizing beam splitter 81 transmits a portion of the light beam 90 (a light beam 91) because the light beam 90 is a P polarizing beam. The discharge tube 1 amplifies the light beam 91 to output a light beam 92. The polarizing beam splitter 5 transmits the light beam 92 because the light beam 12 is P polarized. The transmitted light beam is reflected at the second total reflection mirror 3 and then is transmitted through the polarizing beam splitter 5 again as a light beam 93. The light beam 93 is amplified by the discharge tube 1 to output a light beam 94. A portion of the light beam 94 transmits the polarizing beam splitter 81 as a light beam 89 which maintains oscillation in the similar manner mentioned earlier. Other portion of the light beam 94 is reflected at the polarizing beam splitter 81 as a light beam 95. The light beam 95 is transmitted through the quarter-wave plate 4. The transmitted light beam is reflected at the third total mirror 8 and transmits the quarter-wave plate 4 again where P polarizing beam is converted into S polarizing beam, i.e., a light beam 96. This twice transmitting through the quarter-wave plate 4 is equivalent to one transmitting though a half-wave plate 5. It is known that if an optical axis of the quarter-wave plate 4 is set such that its ooptical angle has an inclination angle of 45° with respect to polarizing plane of the incident light, the P polarized incident light is converted into S polarizing light totally.

The polarizing beam splitter 81 reflects 100% of S polarizing light beam 96 to produce S polarizing light beam 97 which is amplified by the discharge tube 1. The amplified S polarizing light beam 98 is reflected 100% at the polarizing beam splitter 5 entirely to output S polarizing output light beam 99.

As mentioned above, deformation and deterioration of the Fabry-Perot etalon 6 decreases considerably because an intensity of the output light beam 99 is larger than that of the light beam 89 incident to the Fabry-Perot etalon 6 by the gain of the laser medium, i.e., the output light beam is taken out after amplifying by the discharge tube 1. Deformation and deterioration of the Fabry-Perot etalon 6 in this embodiment decrease further compared with the first embodiment because the light beam 90 whose wavelength is selected is amplified by the discharge tube 1 three times, on the other hand, the light beam 10 whose wavelength is selected is amplified twice.

Figure 26:
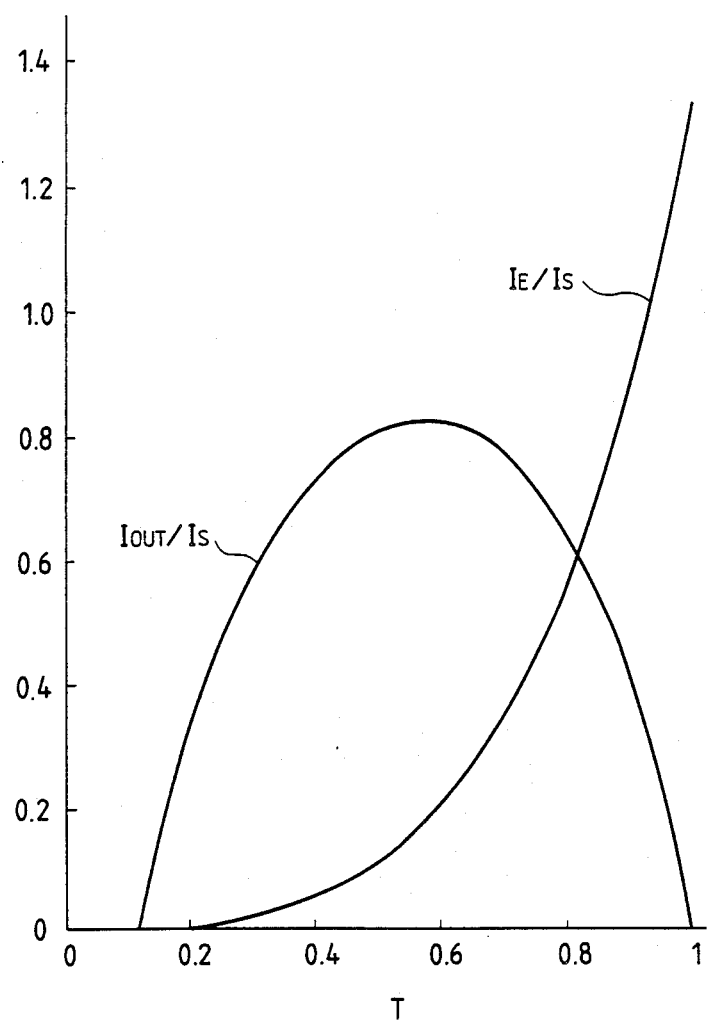
FIG. 26 shows calculation results showing relationship between light intensity of output light beam and light intensity of the beam 89.

FIG. 26 shows calculation results showing relationship between light intensity of output light beam and light intensity of the beam 89 as light load of the Fabry-Perot etalon 6 with respect to transmittance of P component in the polarizing beam splitter 81. This result is obtained by equations described at "Saturation Effects in High-Gain Lasers" by W. W. RIGROD, Journal of Applied Physics, Vol. 36, No 8, P2487-2490, Aug. 1965 (Eqs. 7 and 11 of the document). The results show output light intensity Iout/Is and etalon load light intensity $I_E$/Is which are normalized by saturation light intensity Is with respect to transmittance of P polarizing light beam of polarizing beam splitter 8.

Figure 7:
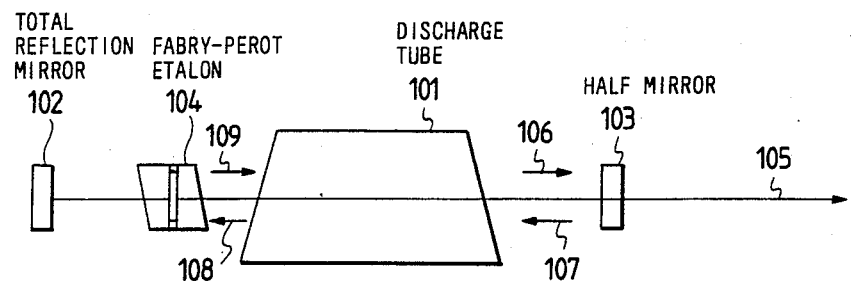
FIG. 7 is a front view of a prior art laser apparatus.
Figure 8:
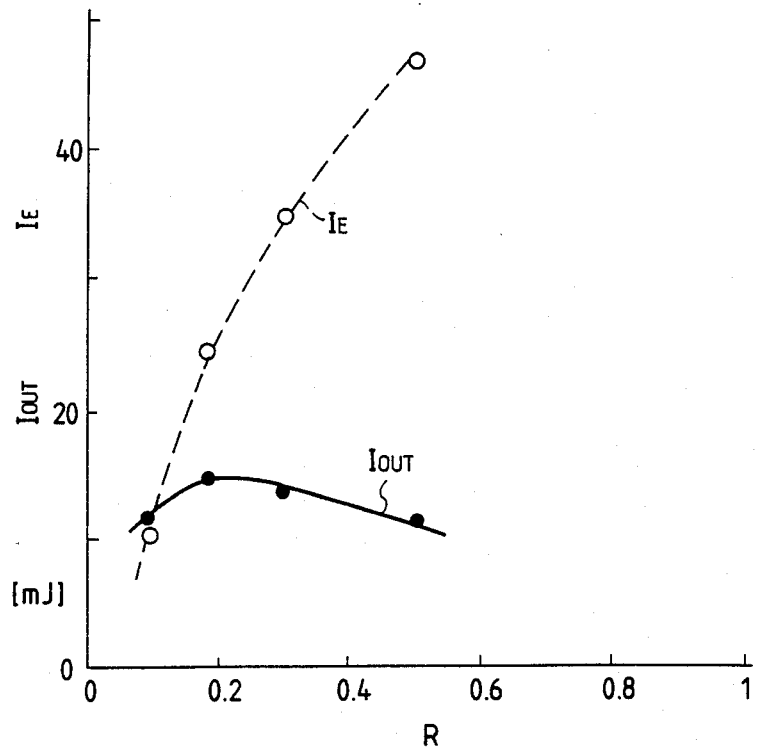
FIG. 8 is an explanatory chart of the prior art.
Figure 27:
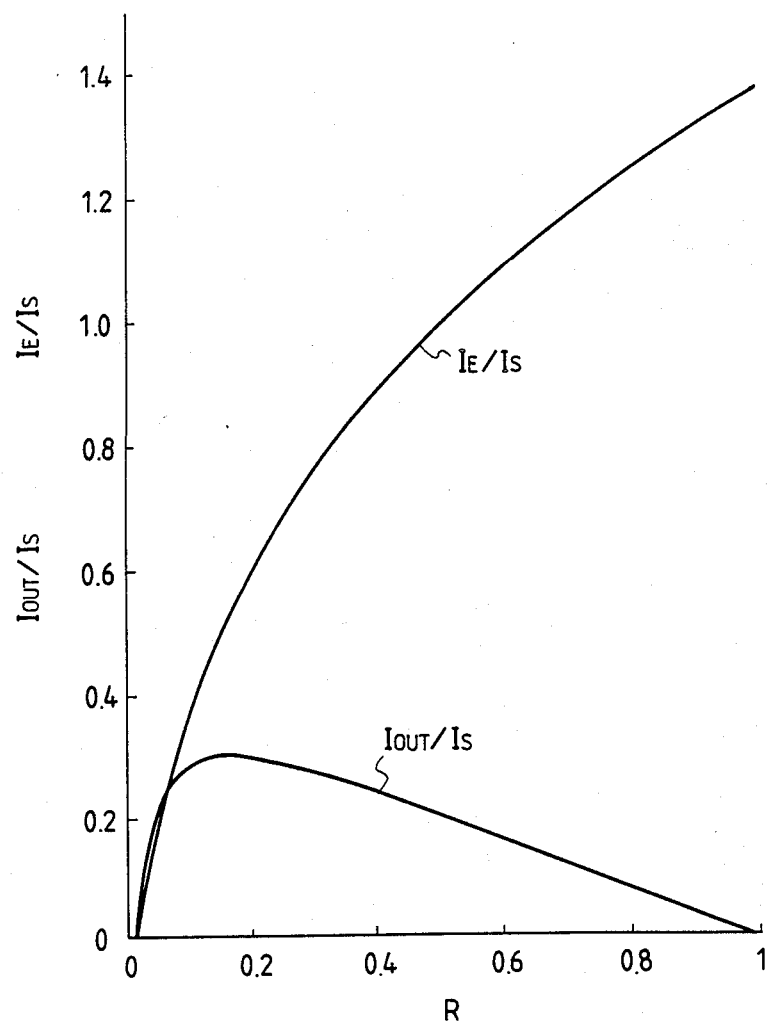
FIG. 27 shows calculation results showing relationship between light intensity of output light beam and light intensity of the beam 108.

FIG. 27 shows calculation results showing relationship between light intensity of output light beam and light intensity of the beam 108 as light load of the Fabry-Perot etalon 104 of the prior art of FIG. 7. This result is obtained by the equations of the above-mentioned document. The results show output light intensity Iout/Is and etalon load light intensity $I_E$/Is which are normalized by saturation light intensity Is with respect to reflectance R of the half mirror 103.

Comparing the result shown in FIG. 26 of the embodiment of the invention with the result shown in FIG. 27 of the prior art, it is clear that the embodiment of the invention can output the same Iout with smaller value $I_E$ than that of the prior art of FIG. 7. In other words, in FIG. 26, when Iout/Is=0.3, $I_E$/Is =0.004, on the other hand, in FIG. 27, $I_E$/Is=0.41 where the later is more than hundred times the former. Therefore, light intensity of incident light to the Fabry-Perot etalon 6 is reduced considerably. Moreover, there is a remarkable feature as follows:

In FIG. 27 of the prior art, when a value of R is 0.15, the maximum output value Iout/Is=0.31 is obtained. On the other hand, in the embodiment of the present invention, when T=0.58, the maximum output Iout/Is=0.83 is obtained. Thus, the output power of the invention is 2.7 times that of the prior art. That indicates the laser apparatus of the invention is excellent as a laser apparatus.

As mentioned above, in this embodiment, light energy transmitted through the Fabry-Perot etalon 6 is largely reduced and a narrow-band laser apparatus showing an excellent characteristic of output efficiency.

The above-mentioned embodiment is described using Fabry-Perot etalon 6 as an wavelength selection element. However, other wavelength selection elements can be applied to this invention. Hereinbelow will be described other embodiments using such elements.

Figure 20:
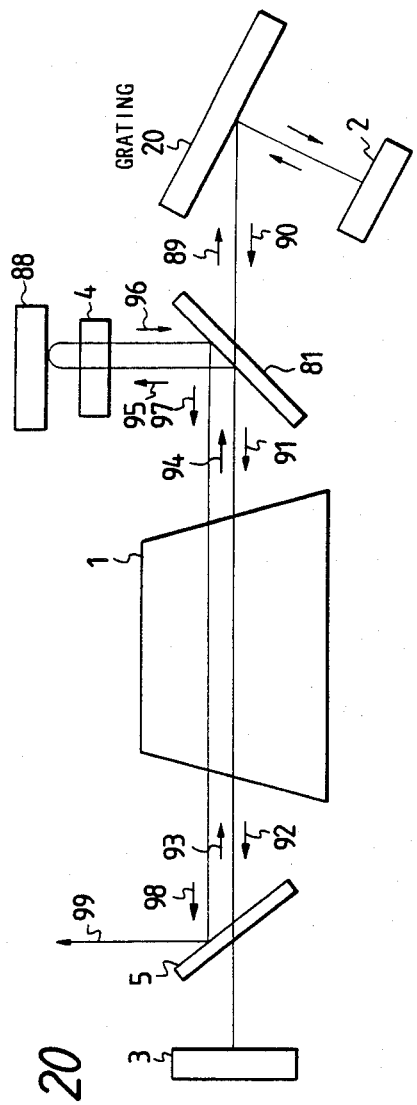
FIG. 20 is a front view of a tenth embodiment.

Referring to FIG. 20, a tenth embodiment of the invention is described. In FIG. 20 which is front view of the tenth embodiment, the structure of this embodiment is the same as that of the ninth embodiment expect that a grating 20 is provided in replace with Fabry-Perot etalon 6. The grating 20 as an wavelength selection element provided between the polarizing beam splitter 5 and the total reflection mirror 2 selects a specified wavelength. Thus, the light resonating is formed by diffracted light by the grating 20. Functions of other portions are the same as the ninth embodiment. Thus, detailed description is omitted.

Figure 21:
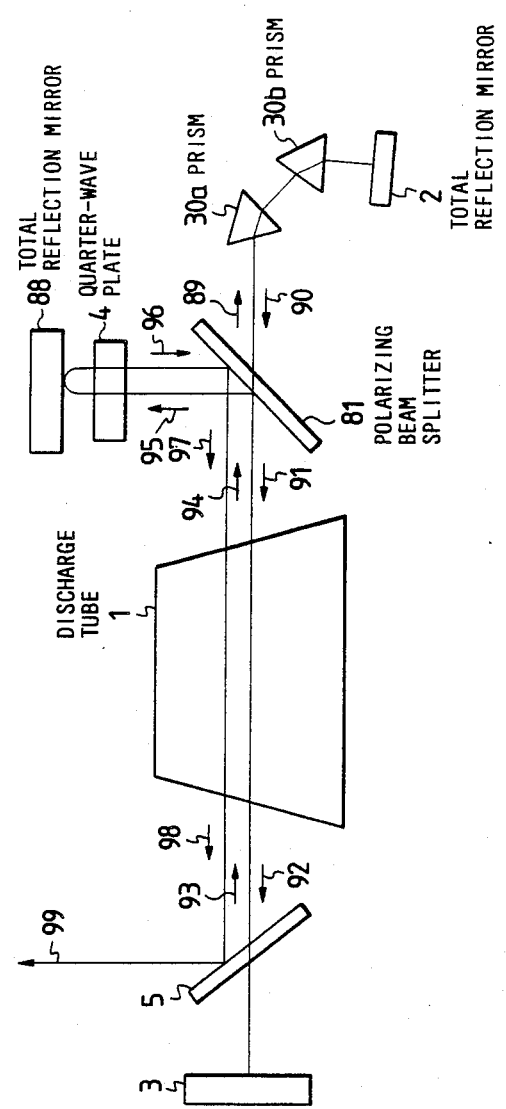
FIG. 21 is a front view of an eleventh embodiment.
Figure 24:
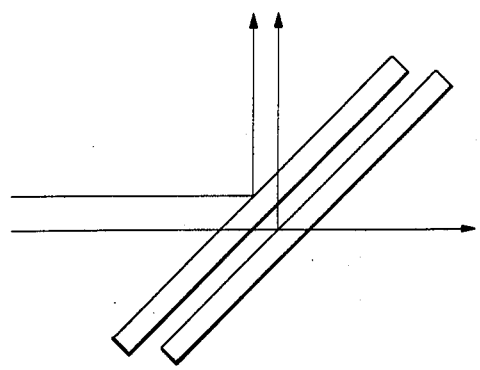
FIG. 24 is a front view of an alternative embodiment of the polarizing beam splitter of the embodiment.

Referring to FIG. 21, an eleventh embodiment of the invention will be described. In FIG. 21 which is a front view of the eleventh embodiment, the structure of this embodiment is the same as that of the ninth embodiment expect that prisms 30a and 30b are provided in replace with Fabry-Perot etalon 6. The prisms 30a and 30b provided between the polarizing beam splitter 5 and the total reflection mirror 2 select a specific wavelength by refraction of light is provided in the light path of the resonator. The resonator light path is formed total reflection mirrors 2 and 3 through the prisms 30a and 30b. Functions of other portions are the same as that of the ninth embodiment. Thus, detailed description is omitted.

As mentioned above, embodiments using a Fabry-Perot etalon, a grating, and prisms as an wavelength selection element are described. When the Fabry-Perot etalon is used, it is considered that the reflection planes thereof where high energy is confined by multi-reflection between confronting reflection planes tends to be deteriorated. This is because this optical element selects wavelength by interference between the two reflection planes confronted. On the other hand, when the grating 20 or prisms 30a and 30b described in second and third embodiments is used, deterioration is reduced because wavelength selection is performed by reflection or refraction, so that the threshold value of these elements is several times as high as that of Fabry-Perot etalon.

Hereinbelow will be described a twelfth embodiment of the invention.

FIGS. 22 and 23 show the twelfth embodiment of the invention of a narrow-band laser apparatus. FIG. 22 is front view of the narrow-band laser apparatus and FIG. 23 is bottom view of a phase retarder prism. In FIGS. 22 and 23, the phase retarder prism 40 functions as the quarter-wave plate 4 and the second total mirror 3 described in the ninth embodiment. Structure of other portions are the same as that of the ninth embodiment.

FIG. 12 is a perspective view of the phase retarder prism 40. In FIG. 12, the phase retarder prism 40 is made of high-transmittance material, such as, synthesized quartz and $CaF_2$. Anti-reflection coat surface (AR coat surface) is formed on a surface 43 where a light beam 29 enters the phase retarder prism 40 and a light beam 26 exits. Further, this surface 43 is inclined by about 2° so that the incident light beam 29 directly reflected at this surface 43 is not mixed with the output light beam 26. Thus, this prism 40 has apex angles 45°, 47°, and 88° unlike the normal type 45° prism. A surface 42 reflects the light beam at a right angle. A dielectric multilayer is formed on the surface 42, which produces P and S polarizing components having 90° phase difference therebetween in accordance with structure and thickness of dielectric layers and is optically equivalent to the quarter-wave plate 4. The light beam reflected at the surface 42 is reflected at a total reflection surface 41 at aright angle and outputted (light beam 26) in the opposite direction. The total reflection mirror surface 41 can be formed easily by a dielectric multilayer.

As mentioned above, according to this embodiment, the phase retarder prism 40 functions as the quarter-wave plate 4 and the second total reflection mirror 88 and thus, it makes the structure of the apparatus simple and adjustment easy.

In the above-mentioned embodiment, a phase retarder prism 40 is used but other wavelength selection elements can be used, such as Fabry-Perot etalon 6, prism 30, or grating 20.

The above-mentioned ninth to twelfth embodiments describe laser apparatus where lasing oscillation is performed by P polarizing component, and then P polarizing component is converted into S component which is amplified to output laser beam. In contrast with this, it is possible that lasing oscillation is performed by S polarizing component, and then S polarizing component is converted into P component which is amplified to output laser beam. In such case, ratios of the polarizing beam splitters 4 and 5 are inverted. Therefore, it is possible to select either polarizing components for oscillation or amplifying in order to make easier carrying out above-mentioned embodiments.

As mentioned above, there various types of polarizing conversion element for producing polarizing components, each component having polarizing plane differenct from each other, such as Fresnel rhomboid prism, thee-time total reflection ultra-achromatic quarter-wave plate, etc. In order to obtain a large-diameter beam for exposure, a first-order or multiple-order quarter-wave plate using a crystal quartz plate is suitable. Moreover, it is not necessary that a quarter-wavelength plate is not accurate. In other words, a phase plate capable of changing the ratio between polarized components S and P can be used.

Further, a multilayer cube polarizing element, a transparent plate of Brewster's angle, a Wollaston prism, etc., can be used as the polarizing beam splitter mentioned above. In order to obtain large diameter beam for exposure, a polarization beam split mirror is excellent.

Figure 25:
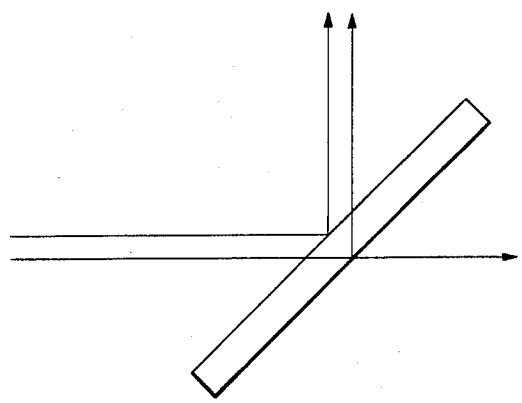
FIG. 25 is a front view of an alternative embodiment of the polarizing beam splitter of the embodiment.

The polarizing beam splitter 4 may be comprise a combination of a perfect polarizing beam splitter 50 with a half mirror 51 for the same function as that of the polarizing beam splitter 4. As shown in FIG. 25 the polarizing beam splitter 81 may also comprise a polarizing beam splitting film 52 made of dielectric layer formed on a plate of quartz or $CaF_2$ whose other surface is covered with semi-transparent film 53.

Further, a multilayer cube polarizing element, a transparent plate of Brewster's angle, a Wollaston prism, etc., can be used as the polarizing beam splitter mentioned above. In order to obtain large diameter beam for exposure, a polarization beam split mirror is excellent.

Moreover, in the above-mentioned embodiments, the wavelength selection element is provided between the polarization beam splitter and the total mirror 2. However, the wavelength selection element can be provided to other position except the light path from the laser medium to the polarization beam splitter where the output laser beam is the most powerful light beam.

Plural Fabry-Perot etalons 6, gratings 20, or prisms 30 used in the above-mentioned embodiments can be used as an wavelength selection element or combination between the above-mentioned elements may be used. Moreover, an element combing of an wavelength selection element with a total reflection mirror, such as echelle grating or echelon grating for utilizing wavelength selection function of gratings. In the prism used in above-mentioned embodiment, a total reflection mirror may be formed on one surface thereof. Further, the number of elements can be reduced by combing function of the quarter-wave plate with that of the total reflection mirror 2, i.e., a total reflection surface is formed on one surface of a plate of $MgF_2$ or quartz phase plate. In other words, the number of elements can be reduced by using an element combining function between these elements for the above-mentioned wavelength selection element, a total reflection mirror, a quarter-wave plate, polarizing beam splitter, etc.

The phase retarder prism 40 used in the above-mentioned embodiment can be replaced with a phase retarder mirror whose reflection surface shows phase retarding function which is similar to the phase retarder prism 40.

It is not necessary that the total reflection mirrors used in the above-mentioned embodiment have 100% reflectance but it may be a reflectance which maintains optical resonating.

As mentioned above, according to this invention, a portion polarized light beam is taken out by polarizing beam splitter from one polarized light beam; the beam taken out is subjected to polarizing direction conversion by a polarizing conversion element and then it is amplified by the laser medium; and then amplified beam is outputted by a polarizing beam splitter. Therefore, light energy transmitted through the wavelength selection element is reduced by an inverse number of the gain of the laser medium, so that deformation or deterioration of the wavelength selection element is reduced. As a result, a narrow-band laser apparatus suitable for an exposure light source for photolithography is provided without variation of selection wavelength or decrease in output power.

What is claimed is:
1. A narrow-band laser appartus comprising:
 (a) an optical resonator including first and second reflecting means;
 (b) laser medium provided in a light path of said optical resonator for emitting light, said laser medium including an exciting means
 (c) polarizing beam splitting means provided between said first reflecting means and said laser medium in said light path for transmitting a first polarizing component therethrough and reflecting a second polarized component of said light;
 (d) selection means provided between said first reflecting means and said polarized beam splitting means in said light path for selecting a given wavelength component from said second polarizing component of said light; and

(e) polarizing conversion means provided between said polarizing beam splitting means and said second reflecting means in said light path for producing said first and second polarizing components in response to said light.

2. A narrow-band laser apparatus as claimed in claim 1, wherein said selection means comprises a Fabry-Perot etalon.

3. A narrow-band laser apparatus as claimed in claim 1, wherein said selection means comprises a grating.

4. A narrow-band laser apparatus as claimed in claim 1, wherein said selection means comprises a prism.

5. A narrow-band laser apparatus as claimed in claim 1, wherein said polarized beam splitting means comprises a dielectric multilayer.

6. A narrow-band laser apparatus as claimed in claim 1, wherein said polarizing beam splitting means comprises a adjusting means for adjusting angle between a light path of the resonator and a surface of said polarized beam splitter.

7. A narrow-band laser apparatus as claimed in claim 1, wherein said polarizing beam splitting means comprises a polarizing beam splitting prism, a dielectric multilayer being formed on said polarizing beam splitting prism.

8. A narrow-band laser apparatus as claimed in claim 1, wherein said laser medium comprises an excimer including noble and halogen gas.

9. A narrow-band laser apparatus as claimed in claim 1, wherein said polarizing conversion means comprises a quartz plate.

10. A narrow-band laser apparatus as claimed in claim 1, wherein a phase retarder mirror is used in place of said second reflecting means and said polarizing conversion means.

11. A narrow-band laser apparatus as claimed in claim 1, wherein a phase retarder prism whose one surface is covered with reflection layer is used in place of a combination of said second reflecting means and polarizing conversion means.

12. A narrow-band laser apparatus as claimed in claim 1, wherein an echelle grating is used in place of a combination of said first reflecting means and said selecting means.

13. A narrow-band laser apparatus as claimed in claim 1, wherein an echelon grating is used inplace of a combination of said first reflecting means and said selecting means.

14. A narrow-band laser apparatus comprising:
(a) an optical resonator including first and second reflecting means;
(b) laser medium provided in a light path of said optical resonator for emitting light, said laser medium including an exciting means;
(c) first polarizing beam splitting means provided between said laser medium and said first reflecting means for transmitting a first polarizing component partially and reflecting a second polarizing component of said light;
(d) selecting means provided between said first reflecting means and said first polarizing beam splitting means for selecting a given wavelength component from said second polarizing component of said light;
(e) a third reflecting means for reflecting back a light ray from said first polarizing beam splitting means;
(f) polarizing conversion means provided between said first polarizing beam splitting means and said third reflecting means for converting said first polarizing component into second polarizing component in response to said light ray; and
(g) second polarizing beam splitting means for transmitting therethrough said first polarizing component and reflecting said second polarizing component of said light provided between said laser medium and said second reflecting means.

15. A narrow-band laser apparatus as claimed in claim 14, wherein said polarizing beam splitting means comprises a adjusting means for adjusting angle between a light path of the resonator and a surface of said polarized beam splitter.

16. A narrow-band laser apparatus as claimed in claim 14, wherein said laser medium comprises an excimer including noble and halogen gases.

17. A narrow-band laser apparatus as claimed in claim 14, wherein said polarizing conversion means comprises a quartz plate.

18. A narrow-band laser apparatus as claimed in claim 14, wherein a phase retarder mirror is used in place of a combination of said second reflecting means and said polarizing conversion means.

19. A narrow-band laser apparatus as claimed in claim 14, wherein an echelle grating is used inplace of a combination of said first reflecting means and said selecting means.

20. A narrow-band laser apparatus as claimed in claim 14, wherein an echelon grating is used in place of a combination of said first reflecting means and said selecting means.

21. A narrow-band laser apparatus as claimed in claim 14, wherein said first polarizing beam splitting means comprises a polarizing beam splitter and a half mirror.

22. A narrow-band laser apparatus as claimed in claim 14, wherein a phase retarder prism whose one surface is covered with a reflection layer is used in place of a combination of said third reflecting means and polarizing conversion means.

* * * * *

UNITED STATES PATENT AND TRADEMARK OFFICE
CERTIFICATE OF CORRECTION

PATENT NO. : 4,985,898

DATED : January 15, 1991

INVENTOR(S) : Furuya et al.

It is certified that error appears in the above-identified patent and that said Letters Patent is hereby corrected as shown below:

Column 14, line 67, change "second" to --first--.

Column 16, replace lines 4 and 5 with the following:

--partially and reflecting the remaining portion of said first component and a second polarizing component of said light;--.

Signed and Sealed this

Fifteenth Day of June, 1993

Attest:

MICHAEL K. KIRK

Attesting Officer     Acting Commissioner of Patents and Trademarks

UNITED STATES PATENT AND TRADEMARK OFFICE
CERTIFICATE OF CORRECTION

PATENT NO. : 4,985,898
DATED : January 15, 1991
INVENTOR(S) : Nobuaki FURUYA ET AL It is certified that error appears in the above-identified patent and that said Letters Patent is hereby corrected as shown below:

On the Title page,
  item [75] Inventors:

change "Keiichro" to --Keiichiro--

Signed and Sealed this

Thirtieth Day of November, 1993

Attest:

BRUCE LEHMAN

Attesting Officer

Commissioner of Patents and Trademarks